United States Patent
Watanabe et al.

[11] Patent Number: 6,140,007
[45] Date of Patent: Oct. 31, 2000

[54] PHOTOSENSITIVE COMPOSITIONS AND PATTERN FORMATION METHOD

[75] Inventors: Masaharu Watanabe; Noriaki Tochizawa; Yukari Imamura; Hideo Kikuchi, all of Chiba, Japan

[73] Assignee: Toyo Gosei Kogyo Co., Ltd., Chiba, Japan

[21] Appl. No.: 09/214,154

[22] PCT Filed: Apr. 27, 1998

[86] PCT No.: PCT/JP98/01926

§ 371 Date: May 12, 1999

§ 102(e) Date: May 12, 1999

[87] PCT Pub. No.: WO98/49600

PCT Pub. Date: Nov. 5, 1998

[30] Foreign Application Priority Data

Apr. 30, 1997 [JP] Japan .................................. 9-112138

[51] Int. Cl.⁷ .................................. G03F 7/12; G03F 7/30
[52] U.S. Cl. .................................. 430/196; 430/7; 430/28; 430/197; 430/326
[58] Field of Search .................................. 430/196, 197, 430/7, 28, 326

[56] References Cited

U.S. PATENT DOCUMENTS 6,020,093  2/2000  Watanabe et al. .................. 430/7

FOREIGN PATENT DOCUMENTS

| | | |
|---|---|---|
| 48-90185 | 11/1973 | Japan . |
| 48-97602 | 12/1973 | Japan . |
| 48-97603 | 12/1973 | Japan . |
| 48-98905 | 12/1973 | Japan . |
| 50-33764 | 4/1975 | Japan .............................. H01J 9/227 |
| 51-4956 | 1/1976 | Japan .............................. H01J 9/227 |
| 55-23163 | 2/1980 | Japan .............................. C08F 8/28 |
| 55-62905 | 5/1980 | Japan .............................. C08F 8/28 |
| 56-11906 | 2/1981 | Japan .............................. C08F 8/30 |
| 2-92905 | 4/1990 | Japan .............................. C08F 12/22 |
| 2-173007 | 7/1990 | Japan .............................. C08F 8/30 |
| 2-204750 | 8/1990 | Japan .............................. H01J 9/227 |
| 5-11442 | 1/1993 | Japan .............................. G03F 7/012 |
| 5-67433 | 3/1993 | Japan .............................. H01J 9/277 |
| 5-113661 | 5/1993 | Japan .............................. G03F 7/012 |
| 6-32823 | 2/1994 | Japan .............................. C08F 8/30 |
| 6-345718 | 12/1994 | Japan .............................. C07C 309/52 |

*Primary Examiner*—John S. Chu
*Attorney, Agent, or Firm*—Sughrue, Mion, Zinn, Macpeak & Seas, PLLC

[57] ABSTRACT

Photosensitive compositions prepared without use of a chromium compound. The compositions exhibit high resolution and satisfactory sensitivity, and do not cause environmental pollution. The photosensitive compositions contain a water-soluble azide compound which serves as a photocrosslinking agent and poly(N-vinylformamide) that is photocrosslinkable in the presence of the water-soluble azide compound.

15 Claims, No Drawings

PHOTOSENSITIVE COMPOSITIONS AND PATTERN FORMATION METHOD

TECHNICAL FIELD

The present invention relates to photosensitive compositions, more particularly to water-soluble photosensitive compositions suitably used for the formation of color filters, phosphor patterns, and black matrices of color cathode-ray tubes.

BACKGROUND ART

Conventionally, negative-type photoresists used for the formation of black matrices and phosphor patterns of color cathode-ray tubes, etc., have made use of resists composed of a water-soluble polymer such as polyvinyl alcohol and a bichromate salt (called PVA-ADC-based resists). Photoresists of this type have a fundamental disadvantage in that they require a special treatment facility for preventing environmental pollution, which is otherwise caused due to the presence of bichromate salts.

As photoresists that are free from the above problem, there have been known photosensitive compositions containing a water-soluble diazide compound, e.g., sodium 4,4'-diazidostilbene-2,2'-disulfonate (hereinafter abbreviated DAS), which serves as a photocrosslinking agent, and a water-soluble polymer that is photocrosslinkable in the presence of the water-soluble diazide compound. For example there are proposed photosensitive compositions containing, as polymer matrices, vinyl alcohol-maleic acid copolymers or salts thereof (Japanese Patent Application Laid-Open (kokai) No. 48-97602), vinyl alcohol-acrylamide copolymers (Japanese Patent Application Laid-Open (kokai) No. 48-97603), or water-soluble polyvinylbutyrals (Japanese Patent Application Laid-Open (kokai) No. 48-98905). In practice, however, these compositions cannot be used because of their low sensitivity. At present, known compositions having sufficient sensitivity in practice include those containing polyvinylpyrrolidone (hereinafter abbreviated PVP) and a water-soluble diazide compound serving as an additive (hereafter, compositions of this type will be referred to as PVP-DAS-based resists; see, for example, Japanese Patent Application Laid-Open (kokai) No. 48-90185), as well as those containing an acrylamide-diacetoneacrylamide copolymer (hereinafter abbreviated PAD) and water-soluble diazide serving as an additive (hereafter, compositions of this type will be referred to as PAD-DAS-based resists; see, for example, Japanese Patent Application Laid-Open (kokai) No. 50-33764).

When used for the formation of black matrices of color cathode-ray tubes, PVA-ADC-based resists have a drawback of poor resolution, in addition to the aforementioned problem of environmental pollution, due to low oxygen permeability and lack of reciprocity-law failure characteristics. In contrast, when PVP-DAS-based resists are used, due to their excessively high oxygen permeability, proper sensitivity cannot be obtained unless the thickness of coating film is increased, which in turn reduces resolution. PAD-DAS-based resists, on the other hand, are endowed with excellent sensitivity and resolution, but after they have undergone formation of resist patterns and coating with graphite they provide poor etching characteristics, and, depending on the type of graphite, etching cannot be effected.

With regard to use for the formation of phosphor patterns, PVA-ADC-based resists are unsatisfactory in terms of both environmental pollution and sensitivity, and in addition, chromium oxide which remains after firing degrades the luminance of the phosphor. In this respect, PVP-DAS-based resists and PAD-DAS-based resists have drawbacks in terms of sensitivity, and therefore cannot be used.

Meanwhile, there are known non-chromium resists which are used for the formation of phosphor patterns and which contain as a photosensitive unit a photosensitive resin obtained through a condensation reaction between unmodified polyvinyl alcohol and a quaternary ammonium salt (e.g., a styrylpyridinium salt or a styrylquinolinium salt) (Japanese Patent Application Laid-Open (kokai) Nos. 55-23163, 55-62905, and 56-11906). However, these resists are also unsatisfactory in terms of resolution.

As described above, there exist no conventional photoresists that simultaneously satisfy requirements with respect to environmental pollution, sensitivity, and resolution. Therefore, there is still need for novel resist materials that exhibit excellent characteristics.

In view of the foregoing, an object of the present invention is to provide photosensitive compositions which do not cause environmental pollution and which exhibit high resolution and satisfactory sensitivity.

DISCLOSURE OF THE INVENTION

In order to overcome the above-described drawbacks, a first mode of the present invention is directed to a photosensitive composition which contains a water-soluble azide compound serving as a photocrosslinking agent and poly (N-vinylformamide) that is photocrosslinkable in the presence of the water-soluble azide compound.

In a second mode of the present invention, the photosensitive composition according to the first mode further contains another water-soluble polymer that is photocrosslinkable in the presence of the above-described water-soluble azide compound.

In a third mode of the present invention, the photosensitive composition according to the second mode contains the water-soluble polymer which comprises at least one species selected from the group consisting of polyvinylpyrrolidone, acrylamide-diacetoneacrylamide copolymers, poly(N,N-dimethylacrylamide), and N,N-dimethylacrylamide-acrylamide copolymers.

In a fourth mode of the present invention, the photosensitive composition according to any of the first through third modes further contains additives and at least one species of water-soluble polymers.

In a fifth mode of the present invention, there is provided a pattern formation method which comprises forming a photosensitive composition layer on a substrate by applying a photosensitive composition according to any of the first through fourth modes; to a substrate performing a pattern exposure on the photosensitive composition layer; and subsequently developing the resulting exposed layer with water or an aqueous developer.

In a sixth mode of the present invention, the above-described substrate employed in the method according to the fifth mode serves as an inner surface of a face plate of a color cathode-ray tube.

A seventh mode of the present invention is directed to a photosensitive composition for the formation of a black matrix, wherein the composition is used for the formation of a black matrix of color cathode-ray tubes and which contains a water-soluble azide compound serving as a photocrosslinking agent and a water-soluble polymer which is photocrosslinkable in the presence of the water-soluble azide compound, wherein the above-described photocrosslinkable water-soluble polymer predominantly contains poly(N-vinylformamide) and further contains another water-soluble polymer having reciprocity-law failure characteristics more prominent than those of the corresponding poly (N-vinylformamide).

In an eighth mode of the present invention, the water-soluble polymer contained in the photosensitive composition according to the seventh mode is at least one species selected from the group consisting of polyvinylpyrrolidone, acrylamide-diacetoneacrylamide copolymers, poly(N,N-dimethylacrylamide), and N,N-dimethylacrylamide-acrylamide copolymers.

A ninth mode of the present invention is directed to a photosensitive composition for the formation of a phosphor pattern, wherein the composition contains a water-soluble azide compound serving as a photocrosslinking agent; a water-soluble polymer which is photocrosslinkable in the presence of the water-soluble azide compound; and a phosphor; and which is prepared by dissolving or dispersing these in an aqueous medium, wherein the above-described photocrosslinkable water-soluble polymer contains poly(N-vinylformamide).

In a tenth mode of the present invention, the photosensitive composition for the formation of a phosphor pattern according to the ninth mode further contains at least one species selected from among saponified products of polyvinyl acetate or acrylic emulsions.

A eleventh mode of the present invention is directed to a photosensitive composition for the formation of a color filter, wherein the composition contains a water-soluble azide compound serving as a photocrosslinking agent; a water-soluble polymer which is photocrosslinkable in the presence of the water-soluble azide compound, and a pigment; and which is prepared by dissolving or dispersing these in an aqueous medium, wherein the above-described photocrosslinkable water-soluble polymer contains poly(N-vinylformamide).

In a twelfth mode of the present invention, the photosensitive composition for the formation of a color filter according to the eleventh mode further contains at least one species selected from among saponified products of polyvinyl acetate or acrylic emulsions.

The present invention provides photosensitive compositions which do not cause environmental pollution and which exhibit high resolution and satisfactory sensitivity, without use of a chromium compound.

The present invention was accomplished based on the finding that satisfactory photosensitive compositions are obtained through use of poly(N-vinylformamide)(called p-NVF), which is not employed in use of this field, and a water-soluble azide compound serving as a photocrosslinking agent.

The p-NVF which may be used in the present invention preferably has a molecular weight of 100,000–5,000,000 (GPC (gel permeation chromatography) analysis: reduced as pullulan) and a viscosity (500–15,000 cp (7% solution, 25° C.)) in view of sensitivity, film-formability, etc.

The water-soluble azide compounds which may be used in the present invention include, but are not limited to, compounds represented by the formulas described below.

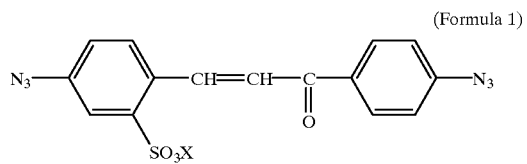
(Formula 1)

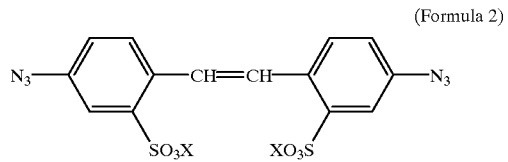
(Formula 2)

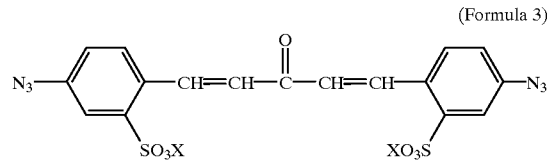
(Formula 3)

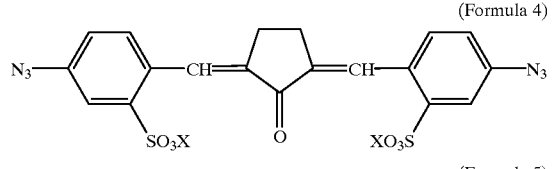
(Formula 4)

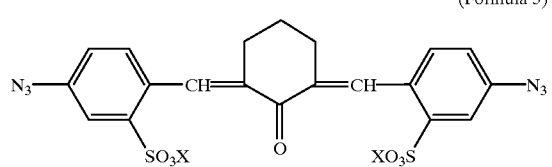
(Formula 5)

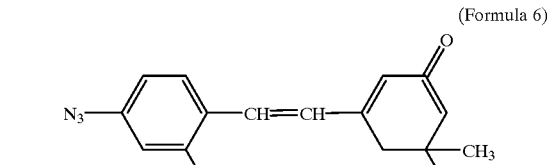
(Formula 6)

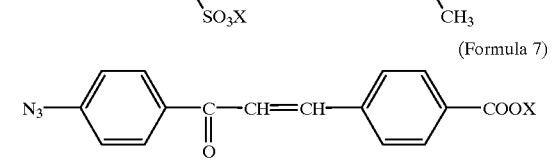
(Formula 7)

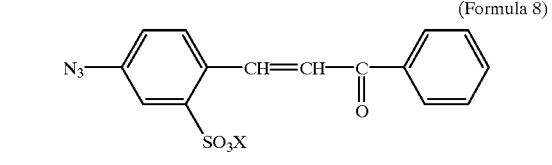
(Formula 8)

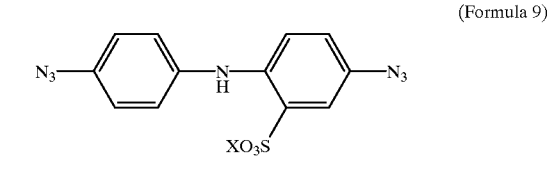
(Formula 9)

wherein X represents lithium, sodium, potassium, ammonium, monoalkylammonium, dialkylammonium, trialkylammonium, or tetraalkylammonium. Furthermore, the water-soluble azide compounds include polymers having a sulfonic acid group or a sulfonate salt group, and an azido group that are described, for example, in Japanese Patent Application Laid-Open (kokai) Nos. 51-4956, 2-173007, 2-92905, 2-204750, 5-11442, 5-67433, 5-113661, 6-32823, and 6-345718. Among the above-described water-soluble azide compounds, those having two or more azide groups in the molecule have particularly good photocrosslinkability. These compounds may be used in combination of two or more species. These water-soluble azide compounds are preferably used in an amount of 2–50 wt. % based on the copolymers. When the content of the water-soluble azide compounds is less than 2%, poor sensitivity results, whereas when the content is in excess of 50%, physical properties of the coating film become poor, both cases are disadvantageous.

The photosensitive compositions of the present invention may be prepared by dissolving or dispersing in a water-based solvent the aforementioned p-NVF, the water-soluble azide compounds, and additives in accordance with use. In this case, water is generally used as the solvent, and to water, there may be added a water-soluble solvent, in an amount of 50 wt. % or less. Examples of such water-soluble solvents include methyl alcohol, ethyl alcohol, isopropyl alcohol, acetone, tetrahydrofuran, dioxane, dimethylformamide, N-methylpyrrolidinone, ethylene glycol monoethyl ether, ethylene glycol monomethyl ether, and propylene glycol monomethyl ether.

As described above, the photosensitive compositions of the present invention may further contain, in addition to the aforementioned p-NVF and water-soluble azide compounds, water-soluble polymers which are crosslinkable in the presence of the above-described water-soluble azide compound. Examples of such crosslinkable water-soluble polymers include polyvinylpyrrolidone and copolymers thereof, and at least one species selected from the group consisting of acrylamide-diacetoneacrylamide copolymers, poly(N,N-dimethylacrylamide), and N,N-dimethylacrylamide-acrylamide copolymers.

To the photosensitive compositions of the present invention, there may be added a water-soluble polymer which may exhibit compatibility to the photosensitive compositions of the present invention in order to further improve the coatability, sensitivity, developability, etc. thereof. However, since addition in an excess amount affects the excellent physical properties of the photosensitive compositions of the present invention, the amount of the water-soluble polymer is preferably 70 wt. % or less based on the total amount of polymers.

Examples of such a water-soluble polymer include a saponified product of polyvinyl acetate, gelatin, polyvinyl methyl ether, a vinyl alcohol-maleic acid copolymer, a water-soluble cellulose derivative, and polyethylene oxide.

Additives such as ethylene glycol, sorbitol, and surfactants may optionally be added to the photosensitive composition of the present invention in order to improve the coatability and moisture-retention property of the composition. A silane coupling agent which serves as an adhesion-accelerator may optionally be added to the photosensitive composition of the present invention in order to improve adhesion to a substrate. Examples of the adhesion-accelerators which may be used include N-β (aminoethyl)-aminopropylmethyldimethoxysilane and N-β (aminoethyl)-γ-aminopropyltrimethoxysilane.

Additives such as a preservative, a defoaming agent, or a pH-adjusting agent may optionally be added to the photosensitive composition of the present invention.

Hydrophobic polymer emulsions may optionally be added to the photosensitive composition of the present invention in order to improve the film strength, water resistance, and adhesion to a variety of substrates. Examples of the hydrophobic emulsions include a polyvinyl acetate emulsion, a polyacrylic acid ester emulsion, and a urethane emulsion.

Further, colorants such as a pigment or a dye may be added to the photosensitive composition of the present invention in order to prevent halation induced by exposure or to obtain a colored image.

In particular, the colored image obtained by dispersing a pigment in the photosensitive composition of the present invention may be applied to a color filter for a liquid crystal display, for a color cathode-ray tube, and for a plasma display; a color proof for printing; a secondary original image for printing; etc.

The above-described photosensitive composition of the present invention may be processed through, for example, forming a photosensitive composition layer on a substrate by applying a photosensitive composition; to a substrate performing a pattern exposure on the photosensitive composition layer; and subsequently developing the resulting exposed layer with water or an aqueous developer.

Examples of the above-described substrate include an inner surface of a surface plate of a color cathode-ray tube. Accordingly, a black matrix, a phosphor pattern, a color filter, etc. of a color cathode-ray tube may be specifically formed.

The pattern formation method using the photosensitive compositions of the present invention will next be described in detail.

(1) Step for Forming a Photosensitive Composition Layer on a Substrate

No particular limitation is imposed on the substrate which may be used in the present invention, any substrate to which the photosensitive composition of the present invention can adhere to may be used. Examples of the above-described substrate include glass such as soda glass, $SiO_2$-treated glass, or ITO-coated glass; plastic films such as polyester films, polyamide films, polyvinyl chloride films, and polypropylene films; metal substrates; metal-laminated plastic sheets and films; metal meshes; and silicon wafers.

Example coating methods for the photosensitive composition of the present invention include spin coating, roll-coater coating, curtain coating, and applicator coating, which have conventionally been employed. The coated layer is subsequently dried through a customary method at a specific temperature, to thereby obtain a coating film.

(2) Pattern Exposure Step

Any customary light source may be used for the exposure of the above-described coating film of the photosensitive composition so long as it emits light having a wavelength at which the water-soluble azide compound can be sensitized. Examples include an ultra-high-pressure mercury lamp, a high-pressure mercury lamp, a xenon lamp, a metal halide lamp, and a chemical lamp. Also, there may be employed any customary exposure method such as the reduction-projection exposure method, the contact exposure method, or the proximity exposure method.

(3) Development Step

The above-described patternwise irradiated coating film of the photosensitive composition may be developed by use of water, a mixture solvent of water-aqueous solvent, or an aqueous solution containing an acid, an alkali, a buffer, a surfactant, etc. Examples of the development methods include spray-development, dipping-development, paddle-development, etc., which are customary methods.

As described above, the pattern formation method of the present invention is particularly advantageously applied to the inner surface of the face plate of a color cathode-ray tube. Application of the above-described pattern formation method to the above-described inner surface of the face plate of a color cathode-ray tube assures high sensitivity and high resolution, and therefore high productivity is realized.

For example, in the case in which the black matrix of a color cathode-ray tube is formed, graphite is applied onto the above-described formed pattern and the coated pattern is treated with an etchant. In this case, a fine black matrix is obtained due to good etchability of the pattern formed in accordance with the present invention.

In the case of formation of a phosphor pattern, the photosensitive composition of the present invention containing a phosphor is homogeneously applied onto a substrate on which the phosphor pattern is formed, e.g., the above-described black matrix on the inner surface of the face plate of a color cathode-ray tube, and is then dried. The coated composition is exposed to a UV beam through a mask having a predetermined pattern, and then developed with water so that only the exposed parts remain. When phosphors of red (R), green (G), and blue (B) are used, the above-described steps are performed three times to thereby complete the phosphor face.

In the case of formation of a color filter, the photosensitive composition of the present invention containing an inorganic pigment is homogeneously applied onto a substrate on which the color filter is formed, e.g., the black matrix-equipped face plate of a color cathode-ray tube, and is then dried. The coated composition is exposed to a UV beam through a mask having a predetermined pattern, and then developed with water so that only the exposed parts remain. When inorganic pigments of red (R), green (G), and blue (B) are used, the above-described steps are performed three times to thereby complete the color filter.

Next will be described the compositions suitable for a variety of uses when the photosensitive compositions of the present invention are used.

First, the reciprocity-law failure characteristics of the photosensitive compositions for the formation of black matrices of color cathode-ray tubes is attempted to be enhanced in order to realize high resolution, since p-NVF used in the present invention has low oxygen permeability. Therefore, a blend of water-soluble polymers which have high reciprocity-law failure characteristics and are photo-crosslinkable in the presence of a water-soluble azide compound, are preferred. As described above, examples of the water-soluble polymers which are suitably used include polyvinylpyrrolidone and copolymers thereof, acrylamide-diacetonacrylamide copolymers, and poly(N,N-dimethylacrylamide), N,N-dimethylacrylamide-acrylamide copolymers. No particular limitation is imposed on the blend ratio, and there may be selected a blend ratio that enhances the resolution of the photosensitive compositions of the present invention and provides high sensitivity without increasing the coating film thickness. For example, p-NVF and another polymer may be blended at a blend ratio of 1:0.1–10.

Meanwhile, no particular blend of water-soluble polymers having high oxygen permeability is needed for the photosensitive compositions of the present invention used for the formation of phosphor patterns, since p-NVF has suitable reciprocity-law failure characteristics. As mentioned above, a photosensitive composition having satisfactorily high resolution and sensitivity is obtained by simply dispersing a predetermined phosphor. For example, a saponified product of polyvinyl acetate and an acrylic emulsion may be used.

No particular limitation is imposed on the phosphor used in this case, and any phosphor which is used in a phosphor-containing display device may be used.

In the compositions of the present invention, preferred proportions of the above-described components are p-NVF (+another polymer):crosslinking agent:phosphor= 100:3–30:300–3000.

When the photosensitive compositions of the present invention used for the formation of color filters are prepared no particular blend of water-soluble polymers having high oxygen permeability is needed. Similar to the compositions used for the formation of phosphor patterns. As mentioned above, a photosensitive composition having satisfactorily high resolution and sensitivity is obtained by simply dispersing a predetermined inorganic pigment. However, a variety of additives may be used in order to regulate oxygen permeability and to improve physical properties of coating films. For example, a saponified product of polyvinyl acetate and an acrylic emulsion may be used.

No particular limitation is imposed on the inorganic pigment used in this case, and there may be used any inorganic pigment which is used in a color filter. The preferred content of incorporation of the inorganic pigment is p-NVF (+another polymer):crosslinking agent:phosphor= 100:3–30:200–2000.

BEST MODE FOR CARRYING OUT THE INVENTION

The present invention will next be described in detail by way of examples, which should not be construed as limiting the invention.

[Manufacture Example of p-NVF]

NVF (75.76 g) and pure water (419.13 g) were placed into a 1-liter reactor equipped with a stirrer, a cooling apparatus, a thermometer, and an inlet for nitrogen gas. Nitrogen gas was passed for two hours while the temperature was maintained at 56° C., in order to purge the oxygen remaining in the apparatus, and there were added an aqueous monomer solution and an aqueous solution of VA-044 (0.15 g/4.96 g pure water) azo type polymerization initiator, (product of Wako Pure Chemical Industries Ltd.). Subsequently, polymerization was performed at the same temperature for five hours while the reaction solution was stirred.

The residual monomer content in the thus-obtained polymer was 1.0% or less, as measured through GPC analysis.

The obtained polymer had a viscosity of 2700 cp (25° C.) at the polymer concentration of 7.0 wt. % and had an average molecular weight of 3,000,000 (reduced as pullulan).

[Example 1]

There was prepared a photosensitive composition having a composition shown below.

| | |
|---|---|
| The above-described polymer 7.0 wt. % | 107.1 g |
| Polyvinylpyrrolidone (K value 90) 20 wt. % | 37.5 g |
| (the above-described polymer:polyvinylpyrrolidone = 50:50) | |
| Sodium 4,4'-diazidostilbene-2,2'-disulfonate (hereinafter abbreviated DAS) | 1.5 g |
| (the above-decribed polymer solid content + polyvinylpyrrolidone solid content | DAS = 100:10) |
| Pure water | 678.9 g |
| Silane coupling agent (KBM-603), Shin-Etsu Chemical Co. Ltd.) | 0.15 g |
| Emulgen-810 (Kao Corporation) | 0.15 g |

The photosensitive composition having the above formulation was filtered by use of a 0.5-μm-membrane filter, the remaining matter was applied onto the inner surface of a face plate of a color cathode-ray tube by spin-coating and then dried, to thereby obtain a coating film having a thickness of 0.60 μm.

Subsequently, a shadowmask having a pitch interval of 0.28 mm was attached to the coating film, and portions in the film corresponding to green, blue, and red were respectively exposed for 15 seconds to the light of an ultra-high pressure mercury lamp having an illuminance of 0.15 (mW/cm$^2$) at 350 nm radiated on the face plate from the distance of 30 cm. The relative humidity during exposure was 45%.

Next, spray-development was performed with hot water (Nozzle: made by Spraying System Co., No. 3, water pressure 2.0 kg/cm$^2$, temperature: 40° C., distance 15 cm). Microscopic observation revealed that the obtained pattern faithfully corresponded to the shadowmask.

Subsequently, a dispersion of graphite (Hitasol 66S: product of Hitachi Powdered Metals Co., Ltd.) was applied onto the above-described patterned face plate so that the graphite layer had a thickness of 1.0 μm, and the coated face plate was charged with an aqueous solution containing 5% H$_2$O$_2$+ 0.1% sulfuric acid and dipped for 60 seconds.

Next, hot water was sprayed for 30 seconds under the following conditions: Nozzle; made by Spraying System Co., No. 10, water pressure 5.0 kg/cm$^2$, temperature: 40° C., and distance 15 cm. Pattern dots and graphite deposited thereon were removed thereby together, to obtain a matrix pattern.

Microscopic observation revealed that the obtained matrix holes faithfully corresponded to the pattern.

[Comparative Example 1]

A photosensitive composition having the following formulation was prepared.

| | |
|---|---|
| Polyvinylpyrrolidone (K value 90) 20 wt. % | 100 g |
| DAS | 2.0 g |
| Pure water | 567 g |
| Silane coupling agent (KBM-603) | 0.2 g |
| Emulgen-810 (Kao Corporation) | 0.2 g |

The photosensitive composition having the above formulation was filtered by use of a 0.5-μm-membrane filter, the filtrate was applied onto the inner surface of a face plate of a color cathode-ray tube by spin-coating and dried, to thereby obtain a coating film having a thickness of 0.75 μm.

Subsequently, a shadowmask having a pitch interval of 0.28 mm was attached to the coating film and portions in the film corresponding to green, blue, and red were respectively exposed for 25 seconds to the light of an ultra-high pressure mercury lamp having an illuminance of 0.15 (mW/cm$^2$) at 350 nm at the face plate from the distance of 30 cm. The relative humidity during exposure was 45%.

Next, spray-development was performed with hot water (Nozzle: made by Spraying System Co., No. 3, water pressure 2.0 kg/cm$^2$, temperature: 40° C., distance 15 cm).

Subsequently, a dispersion of graphite (Hitasol 66S: product of Hitachi Powdered Metals Co., Ltd.) was applied onto the above-described patterned face plate so that the graphite layer had a thickness of 1.0 μm, and the coated face plate was charged with an aqueous solution containing 5% H$_2$O$_2$+ 0.1% sulfuric acid and dipped for 60 seconds.

Next, hot water was sprayed for 30 seconds under the following conditions: Nozzle; made by Spraying System Co., No. 10, water pressure 7.0 kg/cm$^2$, temperature: 40° C., and distance 15 cm. Pattern dots and graphite deposited thereon were removed thereby together, to obtain a matrix pattern. When the resultant matrix holes were observed, they were accompanied by fringes.

[Example 2]

A glass substrate on which the above-described black matrix was formed was precoated with a 0.1% PVA solution, which was then dried. A phosphor slurry having the following composition was applied and dried, to thereby obtain a coating film having a thickness of 9–10 μm. A phosphor pattern was then formed under the below-described conditions. The obtained phosphor pattern exhibited high density and high resolution, and no residual phosphors were found on the black matrix.

| (Composition of the phosphor slurry) | |
|---|---|
| Green phosphor | 100 g |
| 15% Aqueous solution containing a polymer of Reference Example | 30 g |
| 2% Aqueous solution of DAS | 25 g |
| 10% EG-40 (PVA, product of The Nippon Synthetic Chemical Industry Co., Ltd.) | 45 g |
| Pure water | 200 g |
| 5% Tamol 731 (surfactant, product of Rhom & Haas Co.) | 1 g |
| 1% L-62 (BASF Co.) | 2 g |
| (Conditions for pattern formation) | |
| Shadowmask | pitch 0.28 mm |
| Light source-shadowmask distance | 30 cm |
| Light source: Ultra-high pressure mercury lamp | |
| Illuminance at shadowmask face | 0.20 mW/cm$^2$ (UV = 350 nm) |
| Exposure time | 40 seconds |

Development: development by hot water spraying (Nozzle: made by Spraying System Co., No. 3, water pressure 2.0 kg/cm$^2$, temperature: 40° C., distance 15 cm)

[Example 3]

A photosensitive composition having the following formulation was prepared.

| | |
|---|---|
| The above-described polymer 7.0 wt. % | 100 g |
| Sodium 2,5-bis(4'-azido-2'-sulfobenzylidene)cyclopentanonedisulfonate | 1.4 g |
| Red inorganic pigment (Iron oxide-based, av. grain size 100 nm, Ishihara Sangyo Kaisya, Ltd.) | 28 g |
| Pure water | 350 g |
| Silane coupling agent (KBM-603) | 0.14 g |
| 5% Tamol 731 (surfactant, product of Rhom & Haas Co.) | 1.5 g |

The photosensitive composition having the above formulation was applied onto a soda glass plate (10 cm×10 cm) by spin-coating and dried, to thereby obtain a coating film having a thickness of 1.0 μm. Subsequently, portions in the film corresponding to red were exposed for 60 seconds to the light of an ultra-high pressure mercury lamp having an illuminance of 0.20 (mW/cm$^2$) at 350 nm at the glass plate. The distance between the shadowmask having a pitch interval of 0.28 mm and the glass plate was 1 cm, and that between the shadow mask and the lamp was 30 cm.

Next, spray-development was performed with hot water (Nozzle: made by Spraying System Co., No. 3, water pressure 2.0 kg/cm$^2$, temperature: 40° C., distance 15 cm).

Microscopic observation revealed that the obtained pattern of the red pigment layer faithfully corresponded to the shadowmask.

What is claimed is:

1. A photosensitive composition characterized by containing a water-soluble azide compound serving as a photocrosslinking agent and poly(N-vinylformamide) that is photocrosslinkable in the presence of the water-soluble azide compound.

2. A photosensitive composition according to claim 1, which further contains another water-soluble polymer that is photocrosslinkable in the presence of the above-described water-soluble azide compound.

3. A photosensitive composition according to claim 2, wherein said another water-soluble polymer comprises at least one species selected from the group consisting of polyvinylpyrrolidone, acrylamide-diacetoneacrylamide copolymers, poly(N,N-dimethylacrylamide), and N,N-dimethylacrylamide-acrylamide copolymers.

4. A photosensitive composition according to any one of claims 1 through 3, which further contains additives and at least one species of water-soluble polymers.

5. A pattern formation method characterized by comprising a coating film formation step in which a photosensitive composition containing a water-soluble azide compound serving as a photocrosslinking agent and poly(N-vinylformamide) that is photocrosslinkable in the presence of the water-soluble azide compound is applied onto a substrate to thereby form a coating film of the photosensitive composition; an exposure step in which the coating film of the photosensitive composition is irradiated for a desired pattern; and a development step in which the patternwise exposed coating film is developed with water or an aqueous developer.

6. A pattern formation method according to claim 5, wherein the photosensitive composition further contains another water-soluble polymer that is photocrosslinkable in the presence of the above-described water-soluble azide compound.

7. A pattern formation method according to claim 6, wherein said another water-soluble polymer comprises at least one species selected from the group consisting of polyvinylpyrrolidone, acrylamide-diacetoneacrylamide copolymers, poly(N,N-dimethylacrylamide), and N,N-dimethylacrylamide-acrylamide copolymers.

8. A pattern formation method according to claim 5, wherein the photosensitive composition further contains additives and at least one species of water-soluble polymers.

9. A pattern formation method according to any one of claims 5 through 8, wherein the substrate is the inner surface of the face plate of a color cathode-ray tube.

10. A photosensitive composition for the formation of a black matrix, which composition is used for the formation of a black matrix of color cathode-ray tubes and which contains a water-soluble azide compound serving as a photocrosslinking agent and a water-soluble polymer which is photocrosslinkable in the presence of the water-soluble azide compound, wherein the photocrosslinkable water-soluble polymer predominantly contains poly(N-vinylformamide) and further contains another water-soluble polymer having reciprocity-law failure characteristics more prominent than those of the corresponding poly(N-vinylformamide).

11. A photosensitive composition according to claim 10, wherein said another water-soluble polymer comprises at least one species selected from the group consisting of polyvinylpyrrolidone, acrylamide-diacetoneacrylamide copolymers, poly(N,N-dimethylacrylamide), and N,N-dimethylacrylamide-acrylamide copolymers.

12. A photosensitive composition for the formation of a phosphor pattern, which composition contains a water-soluble azide compound serving as a photocrosslinking agent; a water-soluble polymer which is photocrosslinkable in the presence of the water-soluble azide compound; and a phosphor; and which is prepared by dissolving or dispersing these in an aqueous medium, wherein the photocrosslinkable water-soluble polymer contains poly(N-vinylformamide).

13. A photosensitive composition for the formation of a phosphor pattern according to claim 12, which further contains at least one species selected from among saponified products of polyvinyl acetate or acrylic emulsions.

14. A photosensitive composition for the formation of a color filter, which composition contains a water-soluble azide compound serving as a photocrosslinking agent; a water-soluble polymer which is photocrosslinkable in the presence of the water-soluble azide compound, and a pigment; and which is prepared by dissolving or dispersing these in an aqueous medium, wherein the photocrosslinkable water-soluble polymer contains poly(N-vinylformamide).

15. A photosensitive composition for the formation of a color filter according to claim 14, which further contains at least one species selected from among saponified products of polyvinyl acetate or acrylic emulsions.

* * * * *